(12) United States Patent
McLeod et al.

(10) Patent No.: US 6,714,416 B1
(45) Date of Patent: Mar. 30, 2004

(54) MECHANISMS AND TECHNIQUES FOR FASTENING A HEAT SINK TO A CIRCUIT BOARD COMPONENT

(75) Inventors: Gary McLeod, Flaggstaff, AZ (US); I-Chyau Li, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/293,608

(22) Filed: Nov. 13, 2002

(51) Int. Cl.⁷ .................................................. H05K 7/20
(52) U.S. Cl. ........................... 361/719; 24/296; 24/458; 248/510; 257/719; 257/722; 361/704; 361/710; 361/703; 361/720
(58) Field of Search ................................ 165/80.2, 80.3, 165/185; 24/295–296, 457–458; 248/505, 510; 257/718–719, 722, 726–727; 361/703–704, 707, 709–710, 719, 720

(56) References Cited

U.S. PATENT DOCUMENTS

| | | | | |
|---|---|---|---|---|
| 4,607,685 A | | 8/1986 | Mitchell, Jr. ................ | 165/80.3 |
| 5,329,426 A | * | 7/1994 | Villani ......................... | 361/719 |
| 5,640,305 A | * | 6/1997 | Smithers ...................... | 361/719 |
| 5,734,556 A | * | 3/1998 | Saneinejad et al. .......... | 361/719 |
| 5,875,545 A | | 3/1999 | DiStefano et al. ............ | 29/840 |
| 5,894,882 A | * | 4/1999 | Kikuchi et al. ............. | 165/80.3 |
| 6,198,630 B1 | | 3/2001 | Cromwell ..................... | 361/704 |
| 6,208,517 B1 | * | 3/2001 | Prince et al. ................ | 361/704 |
| 6,222,734 B1 | * | 4/2001 | Bookhardt et al. .......... | 361/719 |
| 6,269,863 B1 | * | 8/2001 | Wyler ......................... | 165/80.3 |
| 6,293,331 B1 | | 9/2001 | Wang ......................... | 165/80.3 |
| 6,315,038 B1 | | 11/2001 | Chiu ........................... | 165/185 |
| 6,353,537 B2 | * | 3/2002 | Egawa ........................ | 361/704 |
| 6,401,807 B1 | * | 6/2002 | Wyler et al. ................. | 165/121 |
| 6,430,052 B1 | | 8/2002 | Kordes et al. ............... | 361/719 |
| 6,492,202 B1 | * | 12/2002 | Lober et al. ................. | 438/122 |

OTHER PUBLICATIONS

TCM Thermal Reticle 32262, Research Disclosure, Feb. 1991, No. 322, Kenneth Mason Publications Ltd., England, 1 Page.
Assembled Heat Sinks Folded Assemblies, Sep. 20, 2002, http://www.aavidthermalloy.com/products/foldedfin/index-.shtml, 2 Pages.

* cited by examiner

Primary Examiner—Gregory D. Thompson
(74) Attorney, Agent, or Firm—Chapin & Huang, L.L.C.; David E. Huang, Esq.

(57) ABSTRACT

A heat sink apparatus includes a heat sink having a plurality of circuit board component contact portions and a plurality of fin portions extending from the contact portions. The circuit board component contact portions of the heat sink conform to a surface of the circuit board component when coupled to the circuit board component, thereby providing a thermal coupling between the fin portions of the heat sink and the associated circuit board component. The heat sink apparatus also includes a retainer, such as a double buckling beam retainer, that secures the heat sink to the circuit board component. The retainer causes the circuit board component contact portions of the heat sink conform to the surface of the circuit board component, thereby providing thermal contact between the heat sink and circuit board component contact portions and alleviating the need for a base portion associated with the heat sink, as in conventional mechanisms. The retainer attaches to retainer clips in communication with the circuit board, thereby allowing removal of the heat sink from the circuit board component. The retainer clips include surface mount clips that attach directly to the surface of the circuit board or horseshoe clips that mount to the circuit board using fasteners located within openings having a diameter between 0.00160 inches and 0.0500 inches. Such clips utilize a relatively small circuit board area and thereby do not substantially affect the area available for electronic components and traces on the circuit board.

20 Claims, 6 Drawing Sheets ated circuits (ICs), resistors, and inductors. Typically, these circuit board components generate heat during operation. A fan assembly typically generates an air stream that passes over the components and carries the heat away. The air stream removes the heat so that the components do not operate in an unsafe temperature range, i.e., an excessively high temperature range that would cause the components to operate improperly (e.g., generate a signal incorrectly) or sustain damage (e.g., overheat, burnout, etc.).

MECHANISMS AND TECHNIQUES FOR FASTENING A HEAT SINK TO A CIRCUIT BOARD COMPONENT

BACKGROUND OF THE INVENTION

A typical circuit board includes a section of circuit board material (e.g., fiberglass, copper, vias, etc.) and circuit board components that are mounted to the section of circuit board material. Examples of circuit board components include integrated circuits (ICs), resistors, and inductors. Typically, these circuit board components generate heat during operation. A fan assembly typically generates an air stream that passes over the components and carries the heat away. The air stream removes the heat so that the components do not operate in an unsafe temperature range, i.e., an excessively high temperature range that would cause the components to operate improperly (e.g., generate a signal incorrectly) or sustain damage (e.g., overheat, burnout, etc.).

Some ICs include heat sinks to facilitate cooling. In general, a heat sink is a flanged metallic device that attaches directly to the package of the IC. As the IC generates heat, heat flows from the IC package to the heat sink, and dissipates into the surrounding air. The air stream generated by the fan assembly then carries the heat away thus cooling the IC.

One conventional type of heat sink is the folded fin heat sink, typically formed of a folded fin portion and a base portion. The folded fin portion is fabricated from a continuous sheet of thermally conductive material, such as metal, folded into a plurality of base contact portions and a plurality of protrusions or fins to maximize the surface area of the heat sink, thereby maximizing thermal conduction from the IC. Each fin includes a first fin wall, a second fin wall, and a connection portion between the first fin wall and the second fin wall, the connection portion opposing the base contact portion. A plurality of fins connected by a plurality of base portions forms the folded fin portion of the heat sink. The base plate portion is relatively thick and attaches to the base contact portions of the folded fin portion. The base portion is formed from a thermally conductive material, such as aluminum, to provide a thermal coupling between the folded fin portion of the heat sink and the associated circuit board component.

Conventionally, a securing mechanism couples the heat sink to the circuit board component. One mechanism for securing a heat sink to a circuit board component includes a direct attachment mechanism. In the direct attachment mechanism, an assembler (e.g., a technician working in an assembly line) couples the heat sink to the circuit board component using an adhesive. For example, certain circuit board components require assemblers to mount heat sinks to the circuit board components using a flexible adhesive. The flexible adhesive permits thermal expansion of the circuit board components without inducing large displacement stresses between the heat sink and the circuit board component.

Another securing mechanism involves mechanically attaching the heat sink to the circuit board in the vicinity of the circuit board component using springs to secure the heat sink to the circuit board. The springs contact the heat sink and secure the heat sink to the circuit board component by attaching to the circuit board using screws and bolster plates. An assembler places the screws within openings in the circuit board and secures the screws to the bolster plates located on the surface of the circuit board opposite to the heat sink.

Yet another conventional attachment mechanism involves spring clips. Spring clips contact the heat sink and couple the heat sink to the circuit board component. The spring clips secure the heat sink to the circuit board by attaching directly into openings defined by the circuit board in the area of the circuit board component.

SUMMARY OF THE INVENTION

Conventional techniques for securing a heat sink to a circuit board component suffer from a variety of deficiencies.

As described above, one conventional mechanism for securing a heat sink to a circuit board component includes a direct attachment mechanism, such as through the use of an adhesive. When using an adhesive for heat sink attachment to a circuit board component, a user cannot remove the heat sink from the circuit board component without damaging the circuit board component. In cases where the circuit board component having the adhered attached heat sink becomes damaged or malfunctions, a user must replace the circuit board component, rather than attempt to repair to component, because of the potential for damaging the component when removing the heat sink. For relatively expensive heat sinks, such a solution can become costly over time.

Another conventional mechanism of securing the heat sink to the circuit board component, as described above, involves mechanically attaching the heat sink around the circuit board component using springs to secure the heat sink to the circuit board component and using screws and bolster plates to secure the springs to the circuit board. Relatively large circuit board components, however, require a relatively large number of screws and bolster plates to secure the heat sinks to the circuit board components. Using a relatively large number of screws and plates increases the weight of the circuit boards, thereby making the circuit boards cumbersome to handle. Furthermore, relatively large circuit board components (e.g., up to 2500 pins) require relatively large forces to maintain thermal contact between the heat sinks and the components. The large forces require relatively large screws (e.g., 0.375 inch diameter) to secure the springs to the circuit boards and, therefore, require relatively large openings in the circuit board to provide access for the screws. Multiple large openings within the circuit board reduce the area available for electronic components and traces.

Another conventional mechanism for securing the heat sink to the circuit board component, as described above, involves the use of spring clips. T he spring clips couple the heat sink to the circuit board component and secure the heat sink to the circuit board by attaching directly into openings defined by the circuit board in the area of the circuit board component. Similar to the above-described attachment method, the holes for the spring clips are relatively large thereby reducing the area available for electronic components and traces on the circuit board. Furthermore, in this method, after insertion of the spring clips into the openings, each spring clip directly contacts the edge of each opening. Over time, vibrations in the circuit board can cause the spring clip to wear against the hole, thereby abrading the hole and leading to possible failure of the spring clip.

Also as described above, one conventional type of heat sink used in conjunction with circuit board component cooling is the folded fin heat sink. As described, the folded fin heat sink typically includes a folded fin portion and a base portion. While the folded fin heat portion provides thermal dissipation for heat generated by the circuit board component, the base of the folded fin heat sink is, typically, relatively thick, thereby increasing the weight of the circuit board when used. Furthermore, conventional circuit board components typically include non-planar heat sink mounting surfaces. For example, conventional circuit board components, such as application specific integrated circuits (ASIC), include a bow on the heat sink mounting surface of approximately 0.0012 inches. Therefore, an attachment mechanism must generate relatively large forces on a planar base plate of the folded fin heat sink to provide adequate thermal contact between the heat sink base plate and the circuit board component, such as provided by the a heat sink attachment mechanisms described above.

By contrast to the prior heat sink attachment mechanism, embodiments of the present invention significantly overcome such deficiencies and provide mechanisms and techniques for securing a heat sink to a circuit board component. In one embodiment, a heat sink apparatus includes a heat sink having a plurality of circuit board component contact portions and a plurality of fin portions extending from the contact portions. The circuit board component contact portions of the heat sink conform to a surface of the circuit board component when coupled to the circuit board component, thereby providing a thermal coupling between the fin portions of the heat sink and the associated circuit board component.

The heat sink apparatus also includes a retainer, such as a double buckling beam retainer, that secures the heat sink to the circuit board component. The retainer causes the circuit board component contact portions of the heat sink conform to the surface of the circuit board component. Such conformation provides thermal contact between the heat sink and circuit board component contact portions to dissipate heat from the circuit board component and alleviating the need for a base portion associated with the heat sink, as in conventional mechanisms. The retainer attaches to retainer clips in communication with the circuit board, thereby allowing removal of the heat sink from the circuit board component. The retainer clips include surface mount clips that attach directly to the surface of the circuit board or horseshoe clips that mount to the circuit board using fasteners located within openings having a diameter substantially between a range of 0.00160 inches and 0.0500 inches. Such clips utilize a relatively small circuit board area and thereby do not substantially affect the area available for electronic components and traces on the circuit board.

In one embodiment, the invention relates to a heat sink apparatus for cooling a circuit board component mounted to a circuit board. The heat sink apparatus includes a heat sink having a plurality of circuit board component contact portions and a plurality of fin portions extending from the contact portions, a retainer in communication with the circuit board component contact portions of the heat sink, and at least two retainer clips coupled to the circuit board. The circuit board component contact portions conform to a surface of the circuit board component when coupled to the circuit board component. The retainer engages with the retainer clips to couple the circuit board component contact portions of the heat sink to a surface of the circuit board component and secures the heat sink to the circuit board component. The retainer causes the circuit board component contact portions of the heat sink to conform to the surface of the circuit board component. The compliance of the heat sink provides thermal connectivity between the heat sink and the circuit board component and reduces the attachment forces required between the heat sink and the circuit board component. In this arrangement, a user can disengage the retainer from the clips to remove the heat sink from the circuit board component. Furthermore, the use of the heat sink without a base plate reduces the weigh of the heat sink apparatus.

In another embodiment, the retainer is a double buckling beam retainer that causes the circuit board component contact portions of the heat sink to conform to the surface of the circuit board component. The retainer, therefore, enhances thermal contact between the heat sink and the circuit board component.

In another embodiment, the retainer clips include surface mount clips coupled to a first surface of the circuit board. The surface mount clips utilize a relatively small circuit board area and do not substantially reduce the area available for electronic components and traces on the circuit board. Each surface mount clip can include a plurality of mounting pads. In one embodiment, each mounting pad forms an angle relative to the first surface of the circuit board, the angle of each mounting pad allowing for distribution of solder between the plurality of mounting pads and the first surface of the circuit board.

In another embodiment the retainer clips include horseshoe clips coupled to the circuit board using a plurality fasteners. In this embodiment, the circuit board defines a plurality of openings for the fasteners, each opening having a diameter substantially between a range of 0.00160 inches and 0.0500 inches. The horseshoe clips utilize a relatively small circuit board area and do not substantially reduce the area available for electronic components and traces on the circuit board.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION OF EMBODIMENTS

A heat sink apparatus includes a heat sink having a plurality of circuit board component contact portions and a plurality of fin portions extending from the contact portions. The circuit board component contact portions of the heat sink conform to a surface of the circuit board component when coupled to the circuit board component, thereby providing a thermal coupling between the fin portions of the heat sink and the associated circuit board component.

The heat sink apparatus also includes a retainer, such as a double buckling beam retainer, that secures the heat sink to the circuit board component. The retainer causes the circuit board component contact portions of the heat sink conform to the surface of the circuit board component. Such conformation provides thermal contact between the heat sink and circuit board component contact portions to dissipate heat from the circuit board component and alleviating the need for a base portion associated with the heat sink, as in conventional mechanisms. The retainer attaches to retainer clips in communication with the circuit board, thereby allowing removal of the heat sink from the circuit board component. The retainer clips include surface mount clips that attach directly to the surface of the circuit board or horseshoe clips that mount to the circuit board using fasteners located within openings having a diameter between 0.00160 inches and 0.0500 inches. Such clips utilize a relatively small circuit board area and thereby do not substantially affect the area available for electronic components and traces on the circuit board.

Figure 1:
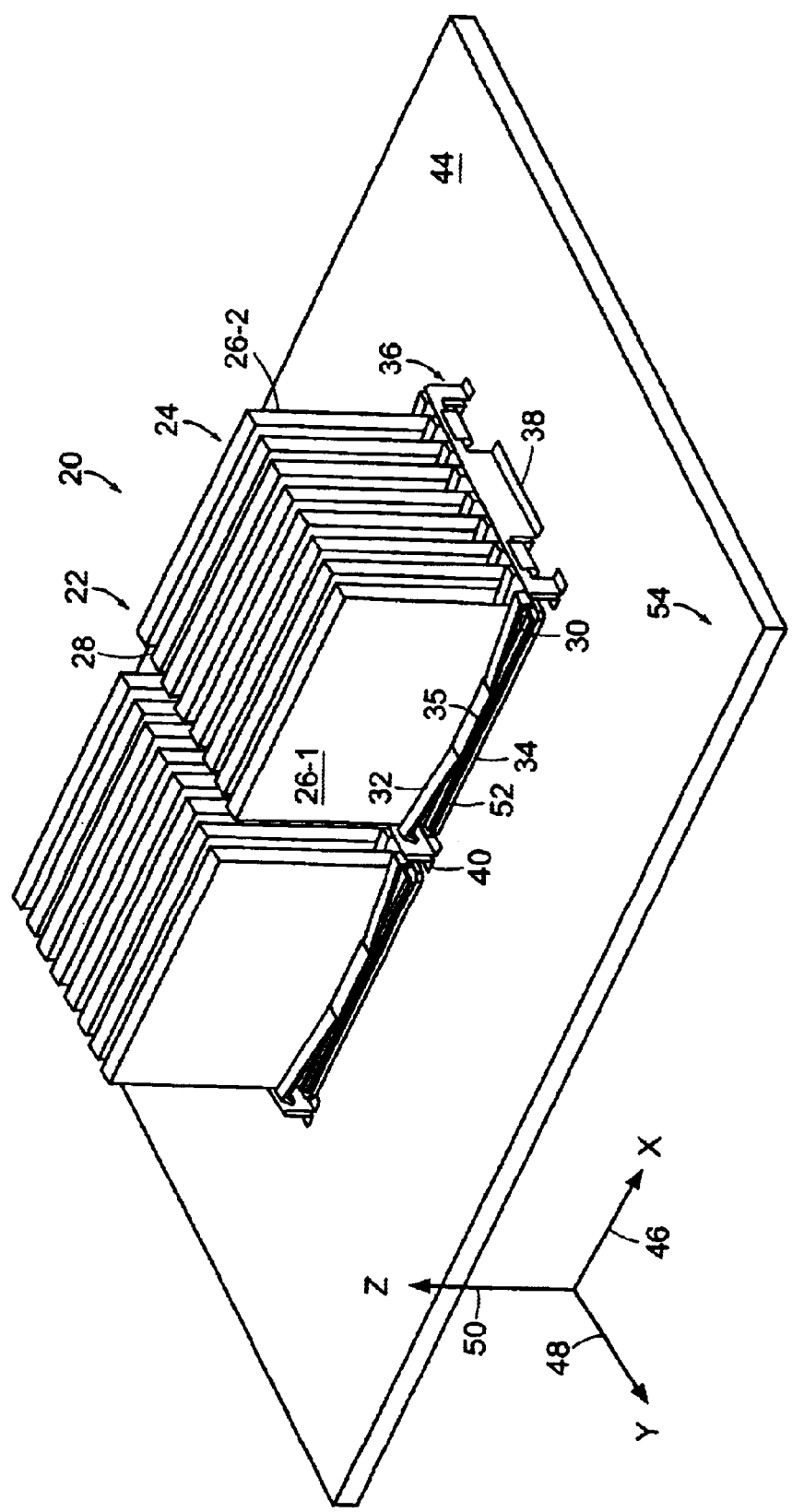
FIG. 1 illustrates a heat sink apparatus, according to one embodiment of the invention.
Figure 2:
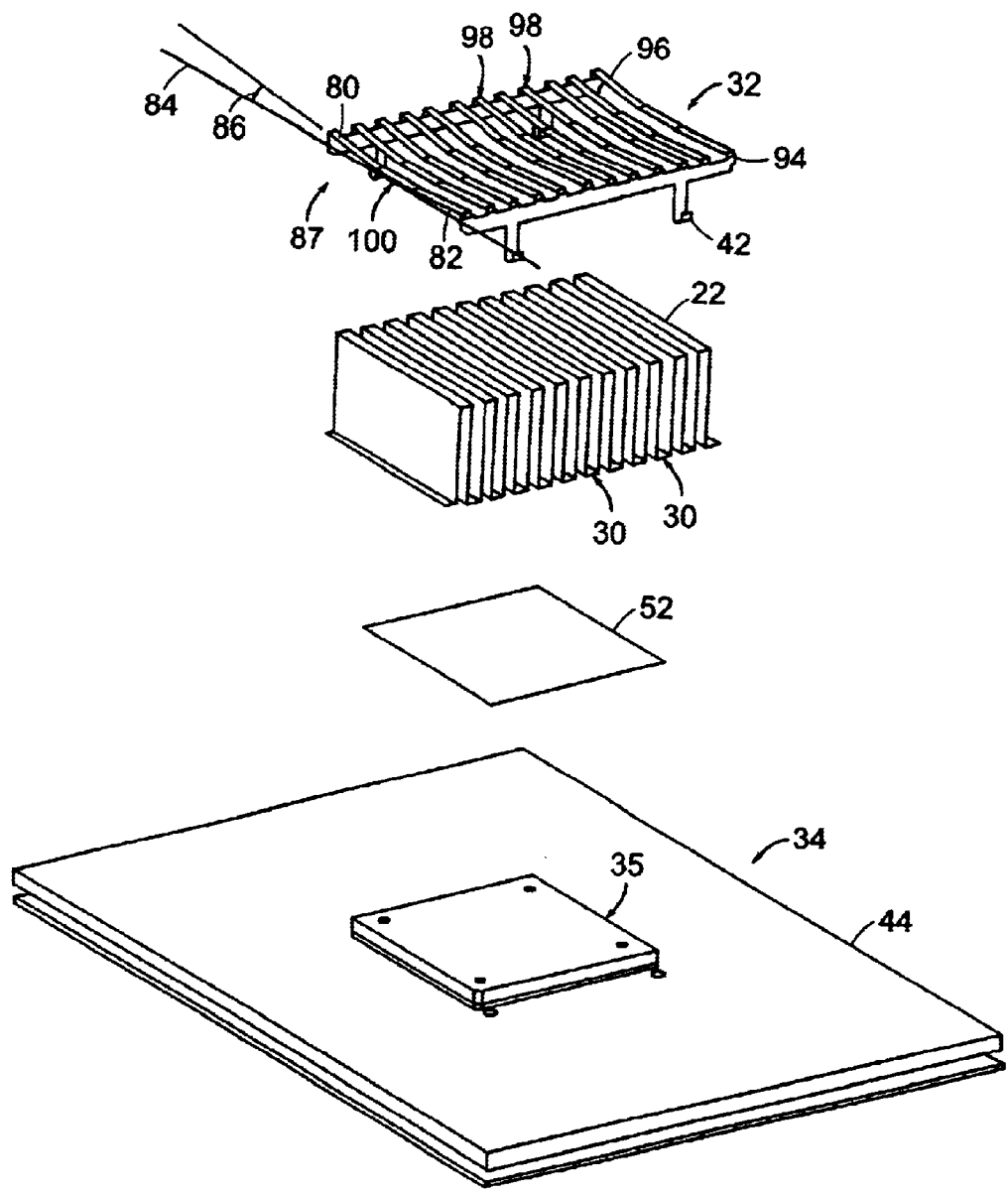
FIG. 2 illustrates an exploded view of the heat sink apparatus of FIG. 1, according to one embodiment of the invention.

FIGS. 1 and 2 illustrate a heat sink apparatus 20 according to one embodiment of the invention. The heal sink apparatus 20 includes a heat sink 22, a retainer 32, and at least two retainer clips 36. The heat sink apparatus 20 mounts to a circuit board component 34, such as an ASIC, attached to a circuit board 44. The combination of the heat sink apparatus 20, the circuit board component 34, and the circuit board 44 forms a circuit board assembly 21.

The heat sink 22 includes a plurality of circuit board component contact portions 30 and a plurality of fin portions 24. During assembly of the heat sink apparatus 20, a retainer 32 engages the circuit board component contact portions 30 of the heat sink 22. The retainer 32 then engages the at least two retainer clips 36 mounted to the circuit board 44 in order to couple circuit board component contact portions 30 of the heat sink 22 to a surface 35 of the circuit board component 34 to secure the heat sink 22 to the circuit board component 34.

The heat sink 22, in one embodiment, includes a folded fin structure, similar to a folded fin heat sink. For example, the heat sink 22 is constructed from a single piece of thermally conductive material having a plurality of fin portions 24, each fin portion 24 including a first fin wall 26-1, a second fin wall 26-2 and a connection portion 28 coupling the first fin wall 26-1 and the second fin wall 26-2. Circuit board component contact portions 30 couple multiple fin portions 24 to form the folded fin structure. The folded fin structure of the heat sink 22 provides a relatively large surface area for dissipations of heat from the circuit board component 34 and, furthermore, provides a relatively low impedance of airflow through the heat sink 22 along the X-direction 46 of the circuit board 44, thereby allowing for dissipations heat from the heat sink 22.

The heat sink 22 attaches to the circuit board component 34 directly such that the circuit board component contact portions 30 conform to the surface 35 of the circuit board component 34 thereby allowing for thermal contact between the heat sink 22 and the circuit board component 34 and alleviating the need for a base plate, such as used with conventional heat sinks 22. Use of the heat sink 22 without a base plate portion reduces the weight of the heat sink 22 compared to a conventional folded fin heat sink having a base plate. In one embodiment, the weight of the heat sink 22 without a base plate is approximately 25 percent of the weight of a conventional folded fin heat sink having the base plate (e.g., reduction of weight by approximately 75%). For example, in the case where a conventional folded fin heat sink and base plate combination weighs 20 lbs., the heat sink 22 having the folded fin portion without the base plate weighs 5 lbs. Because the heat sink 22 weighs less than the conventional heat sink and base plate combination, therefore, the amount of force needed to secure the heat sink 22 to the circuit board component 34 is less that that required by the conventional folded fin heat sink.

The heat sink 22, in another embodiment, is compliant about the X-axis 46 and Y-axis 48 of the circuit board component 34. In this embodiment, the lateral portions 26 of the heat sink 22 bend about the Y-axis 48 and bend about the X-axis 46 thereby allowing the circuit board component contact portions 30 of the heat sink 22 to conform to the surface 35 of the circuit board component 34. Such compliance or bending allows the circuit board component contact portions 30 of the heat sink 22 to contact the surface 35 of the circuit board component 34, thereby allowing for thermal transfer between the heat sink 22 and the circuit board component 34. In conventional circuit board components 34, the heat sink mounting surface of the components 34, such as ASIC, is, typically, a non-planar surface having a bow or curvature to the surface. For example, for conventional ASIC's the bow on the mounting surface is approximately 0.0012 inches. Because the heat sink 22 is compliant about the X-axis 46 and Y-axis 48, the circuit board component contact portions 30 of the heat sink 22, when secured to the circuit board component 34, conform to the curved surface 35 of the circuit board component 34. By conforming to the surface 35 of the circuit board component 34, the folded fin structure of the heat sink 22 reduces the pressure necessary to maintain thermal contact between the heat sink 22 and the circuit board component 34, compared to a conventional heat sink.

For example, a conventional heat sink (e.g., folded fin heat sink having a base plate) requires pressures between approximately 12 and 15 pounds per square inch (psi) to secure the heat sink to a circuit board component 34 and maintain a surface-to-surface contact between the heat sink and circuit board component. Using the heat sink 22 having a compliance about the X-axis 46 and Y-axis 48 reduces the amount of pressure required to secure the heat sink 22 to the circuit board component 34 to between approximately 7 and 8 psi, compared to the conventional folded fin heat sink. The difference between the compliant heat sink 22 and the conventional heat sink amounts to a reduction in pressure of approximately 60 percent.

With respect to the contact area between the heat sink 22 and the circuit board component 34, the contact area between the heat sink 22 and the surface 35 of the circuit board component 34 is relatively less than the contact area between the base plate of a folded fin heat sink and the circuit board component 34. In one embodiment, the contact area between the heat sink 22 and the circuit board component 34 is 40 percent less than the surface area contact between a folded in heat sink having a base plate and a the circuit board component. For example, in the case where a folded in heat sink and base plate combination has a circuit board component contact area of 4 in.$^2$, the circuit board component contact portions 30 of the heat sink 22 have a circuit board component contact area of 1.6 in.$^2$ (e.g., 40% of the area of the conventional heat sink and base plate combination).

Because of the reduced contact area between the heat sink 22 and the circuit board component 34 compared to the contact area between the heat sink and base plate combination in the circuit board component 34, the heat sink 22 requires relatively less force to secure the heat sink 22 to the circuit board component 34. For example, a folded fin heat sink and base plate combination having a contact area of 4 in.$^2$ and requiring the pressure between 12 and 15 pounds per square inch to secure the combination to the circuit board component 34 requires between approximately 48 and 60 pounds of force to secure the combination to the circuit board component 34. By contrast, the heat sink 22 having a contact area of 1.6 in.$^2$ and requiring a pressure between 7 and 8 pounds per square inch requires between approximately 11 and 13 pounds force to secure the heat sink 22 to the circuit board component 34. Therefore, use of the heat sink 22 having a folded fin structure without the use of a base plate reduces the amount of force required to secure a heat sink 22 to the circuit board component 34 compared to a conventional folded fin heat sink.

Another embodiment of the heat sink assembly 20 includes a thermal transfer layer 52 located between the heat sink 22 and the circuit board component 34. For example, the thermal transfer layer 52 is a non-adhesive thermal film, such as a silicone or wax film. The thermal transfer layer 52 provides for thermal transfer between the circuit board component 34 and the circuit board component contact portions 30 of the heat sink 22. In one embodiment, the thermal layer acts to minimize the presence of non-contacting portions (e.g., air gaps) between the heat sink 22 and the surface 35 of the circuit board component 34.

The retainer 32, in one embodiment, includes a frame 94 having a double buckling beam structure 96 and a clip engagement portion 42. After assembly, the double buckling beam structure 96 of the retainer 32 contacts the lateral portions 26 of the heat sink 22 and, upon engagement with the retainer clips 36, causes the circuit board component contact portions 30 of the heat sink 22 to conform to the surface of the circuit board component 34. For example, as illustrated in FIGS. 1 and 2, the double buckling beam structure 96 contacts each circuit board component contact portions 30 of the heat sink 22 such that each beam element 98 of the double buckling beam structure 96 is located between each fin portion 24 of the heat sink 22.

The frame 94 of the retainer 32 also includes a clip engagement portion 42 used to secure the retainer 32 to the at least two retainer clips 36 coupled to the circuit board 44. In one embodiment of the clip engagement portion 42 includes a hook shaped structure that engages the clip 36, thereby allowing the retainer 32 to secure the heat sink 22 to the circuit board 44 and maintain thermal contact between the heat sink 22 and the circuit board component 34. The clip engagement portion 42, furthermore, allows the retainer 32 to maintain forces on the heat sink generated when the retainer 32 engages the retainer clips 36.

For example, when an assembler mounts a double buckling beam retainer 32 to the heat sink 22, the user first depresses the retainer end portions 87 such that the clip engagement portion 42 engages a retainer engagement portion 62 of the retainer clip 62. Depressing the end portions 87 of the retainer 32 loads the lower lateral portions 30 of the heat sink 22 and forces the heat sink 22 against the circuit board component 34. When the assembler engages the clip engagement portions 42 of the retainer 32 with the retainer engagement portions 62 of the retainer clips 36, the clip engagement portions 42 of the retainer creates an expansive force (e.g., spring force) against the retainer engagement portions 62 while the retainer engagement portion 62 creates an equal, compressive force against the clip engagement portions 42 of the retainer 32. Engagement between the portions 42, 62, therefore, maintains the load created by the retainer 32 on the heat sink 22.

As illustrated in FIG. 2, each beam element 98 of the double buckling beam structure 96 includes a first buckling beam portion 80 and a second buckling beam portion 82. The first double beam portion 80 and the second buckling beam portion 82 each form an angle 86 relative to a horizontal reference 84. The angle 86 formed by the buckling beams 80, 82 in one embodiment, creates a spring structure in the retainer 32, thereby causing the retainer 32 to distribute a loading force to circuit board component contact portions 30 of the heat sink 22 when the retainer 32 engages the retainer clips 36.

When the retainer 32 engages the clips 36 of the circuit board 44, for example, the clips 36 cause the buckling beams 80, 82 to bend about a rotational point 100, thereby decreasing the angle 86 in the buckling beams 80, 82 of the retainer 32 relative to the horizontal reference 84. Such bending of the buckling beams 80, 82 increases the contact area between the buckling beams 80, 82 and the circuit board component contact portions 30 of the heat sink 22 and distributes the forces generated by the retainer 32 over the contact portions 30 of the heat sink 22. In one embodiment, when the retainer 32 engages the clips 36 of the circuit board 44, the clips 36 displace (e.g., create bending in) the end portions 87 of the buckling beams 80, 82 a distance of approximately 0.0060 inches, relative to the horizontal reference 84. Because the buckling beams 80, 82 bend about the rotation point 100 when the retainer is secured to the circuit board 44, the retainer 32 conforms to variations in the surface 35 of the circuit board component 34 (e.g., a bowed surface) and is, therefore, relatively unaffected by tolerance differences among different types of circuit board components 34, for example.

The retainer clips 36, in one embodiment, include a first retainer clip 38 and a second retainer clip 40. As shown in FIG. 1, the retainer clips 38, 40 are located on opposite sides of the circuit board component 34 to balance the loads or forces generated by the retainer 32 on the heat sink 22 (e.g., such that the forces generated by the retainer 32 are approximately evenly distributed over the lower lateral portions 30 of the heat sink 22). In one embodiment, for relatively small circuit board component 34, two retainer clips 36 can secure the retainer 32 to the heat sink 22. In another embodiment, for relatively larger circuit board components 34, four or more retainer clips 36 can secure the retainer 32 to the heat sink 22.

As described above, the retainer 32 couples the heat sink 22 to the circuit board component 34, where the heat sink 22 does not include a base plate. The use of the heat sink 22 without a base plate reduces the weight of the heat sink 22, thereby decreasing the forces generated by the retainer 32 to secure the heat sink 22 to the circuit board component 34. Because the retainer 32 generates less force to secure the heat sink 22 to the circuit board component 34, the retainer clips 36, in turn, require less mounting support to withstand the expansive retainer forces created by the retainer 32 and maintain contact with the circuit board 44. Therefore, the relatively lightweight heat sink 22 reduces or eliminates the necessity for bolster plates, fasteners, and the use of relatively large holes in the circuit board 44 to secure the retainer clips 36 to the circuit board 44.

Figure 3:
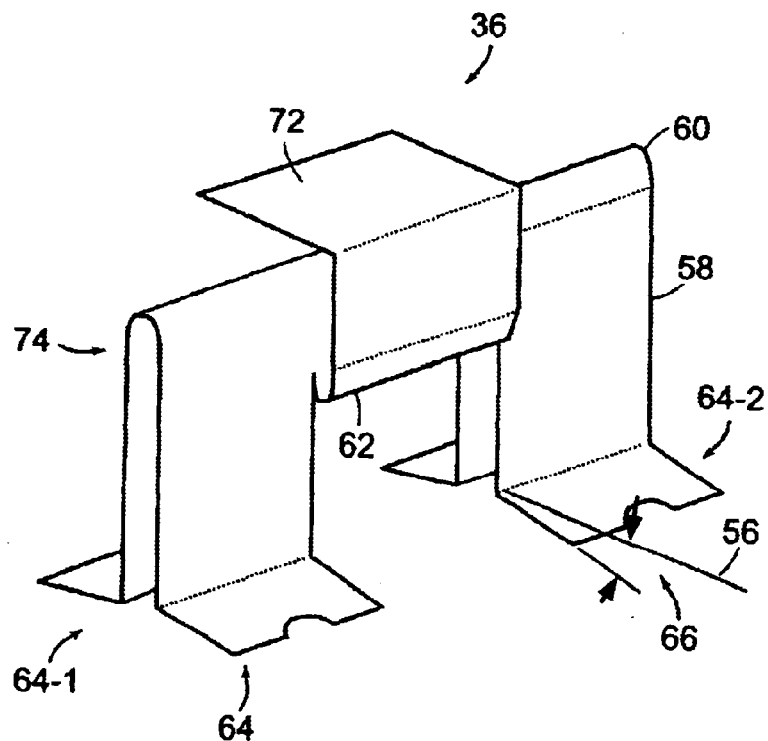
FIG. 3 illustrates a perspective view of a surface mount clip, according to one embodiment of the invention.
Figure 4:
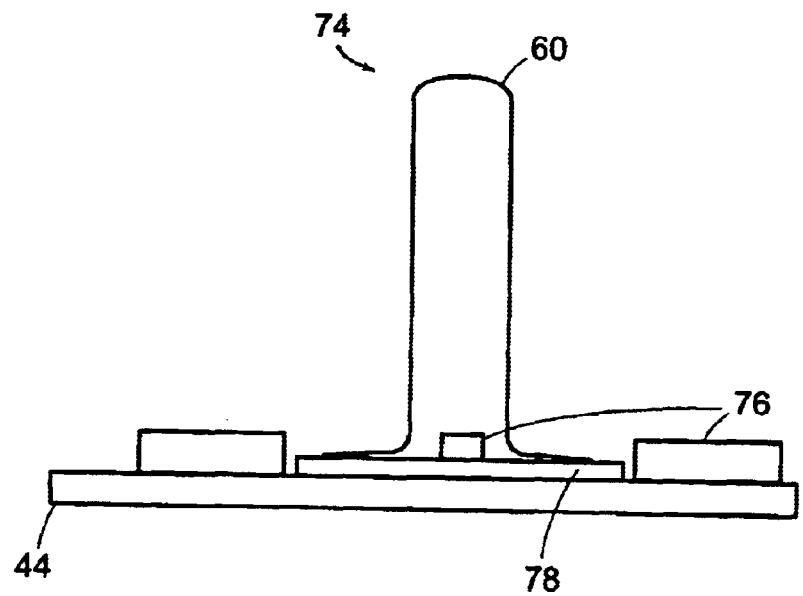
FIG. 4 illustrates a side view of the surface mount clip of FIG. 3, according to one embodiment of the invention.

FIGS. 3 and 4 illustrate an embodiment of a retainer clip 36 for the heat sink apparatus 20. In this embodiment, retainer clip 36 is a surface mount clip 60 that couples to a first surface 54 of the circuit board 44 (e.g. without the use of relatively large holes, bolster plates, or fasteners). The retainer clip 60 maintains the loads or forces generated by the retainer 32 on the heat sink 22.

The surface mount clip 60, in one embodiment, includes a frame 58 forming a U-shaped 74 structure and having plurality of mounting pads 64, a grasping portion 72 and retainer engagement portion 62.

The mounting pads 64 allow coupling of the clip 60 to the circuit board 44. Each mounting pad 64, when secured to the circuit board 44, provides a coupling between the surface mount clip and the circuit board 44. In one embodiment, the interface between a mounting pad 64 of the clip 60 and the circuit board 44 withstands a tension load of approximately 20 pounds of force. Therefore, a surface mount clip 60 having four mounting pads 64, as shown in FIG. 3, can withstand a tension load of approximately 80 pounds of force.

The mounting pads 64 have, in one embodiment, a first mounting pad portion 64-1 and a second mounting pad portion 64-2. The use of the first mounting pad portion 64-1 and the second mounting pad portion 64-2 allows an assembler to secure the mounting clip 60 to the circuit board 44 in a particular orientation relative to the circuit board 44 without shifting of the clip 60. For example, for clips having a single, relatively large mounting pad (e.g., relative to the first mounting pad portion 64-1 and the second mounting pad portion 64-2), during the soldering process, the pad can shift or skew relative to the circuit board. Such shifting limits the precision with which an assembler can mount the clip. By using the clip 60 having the first mounting pad portion 64-1 and the second mounting pad portion 64-2, during assembly, the surface tension of the solder on the first mounting pad portion 64-1 and the second mounting pad portion 64-2 limits shifting or skewing of the pads 64-1, 64-2 relative to the circuit board 44. In turn, use of the first mounting pad portion 64-1 and the second mounting pad portion 64-2 helps to maintain the orientation of the clip 60 relative to the circuit board 44 during assembly.

In one embodiment, during the assembly process, an assembler introduces solder between the mounting pads 64 and solder pads located on the circuit board 44. After hardening or curing of the solder, the solder secures the surface mount clip 60 to the mounting pads 64 (e.g., solder pads) of the circuit board 44. In another embodiment, the mounting pads form an angle 66 relative to a horizontal reference 56, such as an 8° angle. The angle 66 of each mounting pad 64 creates coplanarity (e.g., the relatively largest distance between the solder pads on the circuit board and each mounting pad 64) of the surface mount clip 60. The angle 66 formed by the mounting pads 64 relative to the horizontal reference 56 creates a fillet between the mounting pads and the circuit board 44 and limits creation of an open solder joint between the solder pads on the circuit board and each mounting pad 64, thereby creating a relatively strong coupling interface between the surface mount clip 60 and the circuit board 44.

In another embodiment, the circuit board 44 includes at least one masking portion 76 relative to the clip 60. The masking portions 76 limit or prevent distribution of the solder over a particular portion of the circuit board 44, thereby protecting masked portions (e.g. electronic components) of the circuit board 44. For example, the masking portion 76 is a solder mask that prevents the flow of solder over the masked portions of the circuit board 44.

In another embodiment, the circuit board 44 includes an electromagnetic interference (EMI) shield portion 78 located between the surface mount clip 60 and circuit board 44. The EMI shield portion 78 limits electromagnetic disturbance to the electronic components of the circuit board 44 caused by the surface mount clip 60. As shown in FIG. 4, during the assembly process, an assembler secures the EMI shield portion 78 to the circuit board 44 and couples the surface mount clip 60 to the EMI shield portion 78.

FIG. 3 also illustrates the retainer engagement portion 62 of the surface mount clip 60. As described above, the retainer engagement portion 62 couples with the clip engagement portion 42 of the retainer 32 to secure the heat sink 22 to the circuit board component 34. Coupling of the retainer engagement portion 62 and the clip engagement portion 42 of the retainer 32, in one embodiment, limits inadvertent disengagement of the retainer 32 from the heat sink 22, thereby limiting disassociation of the heat sink 22 and the circuit board component 34.

FIG. 3 also shows a grasping portion 72 associated with the surface mount clip 60. During the assembly process, an assembly device engages the grasping portion 72 of the surface mount clip 60 and utilizes the grasping portion 72 to align the clip 60 on the circuit board 44. In one embodiment, the grasping portion 72 allows the assembly device to align the surface mount clip 60 relative to the circuit board component 34 and the circuit board 44.

Conventional heat sink retaining mechanisms use fasteners and bolster plates to secure the heat sinks to the circuit board components. Relatively heavy heat sinks require relatively large heat sink securing loads. Such relatively large loads, in turn, require relatively stable heat sink retaining mechanisms. For example, to carry relatively large loads, conventional heat sink retaining mechanisms use fasteners having an approximate 0.375 inch diameter, thereby requiring an opening within the circuit board of approximately 0.375 inches in diameter. As described above, because of the structure of the heat sink 22, the retainer 32 generates less force to secure the heat sink 22 to the circuit board component 34. The retainer clips 36, in turn, require less mounting support to withstand the expansive retainer forces created by the retainer 32 and maintain contact with the circuit board 44. Therefore, the relatively lightweight heat sink 22 reduces or eliminates the necessity for bolster plates, fasteners, and the use of relatively large holes in the circuit board 44 to mount the retainer clips 36 to the circuit board 44.

Figure 5:
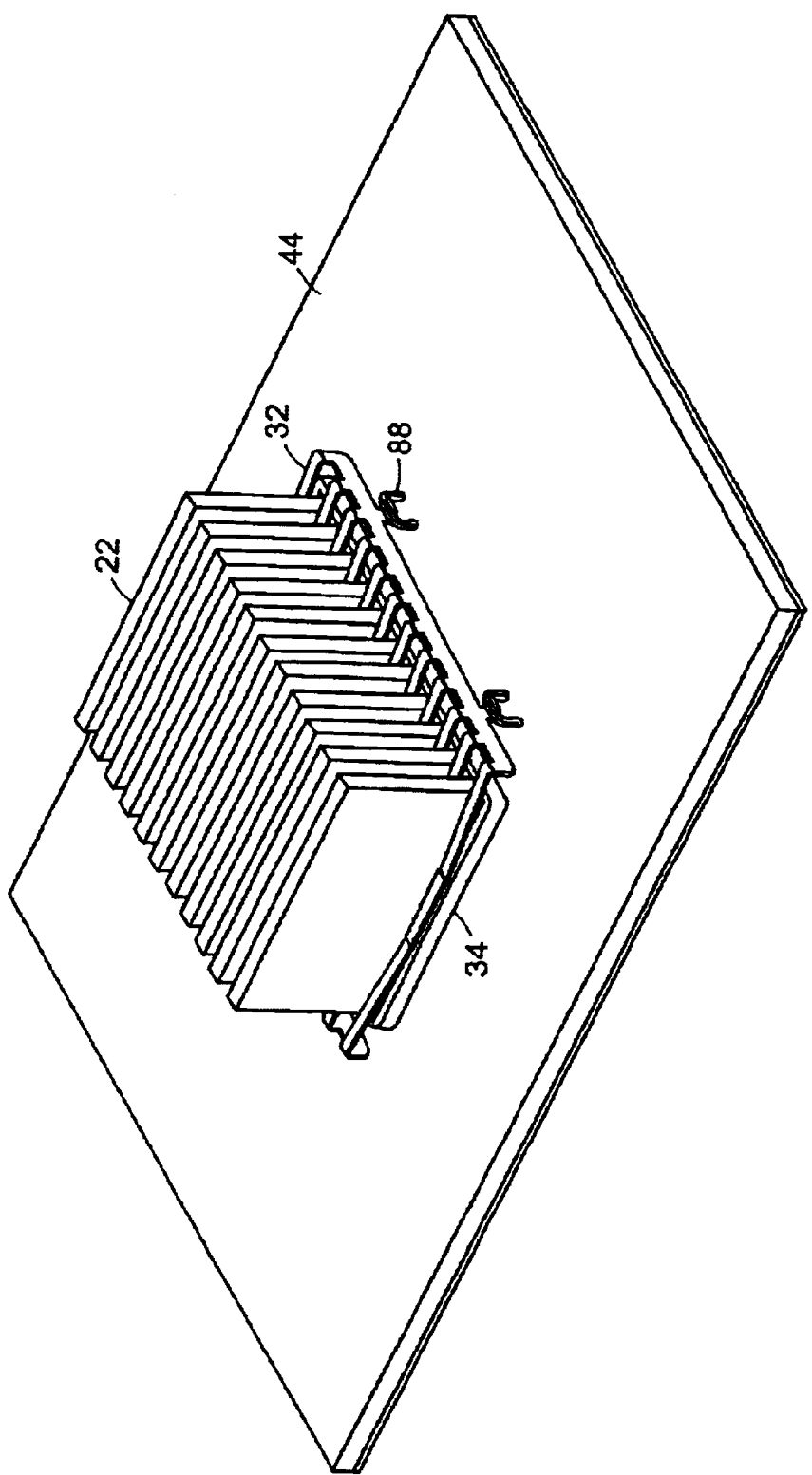
FIG. 5 illustrates a heat sink apparatus, according to another embodiment of the invention.
Figure 6:
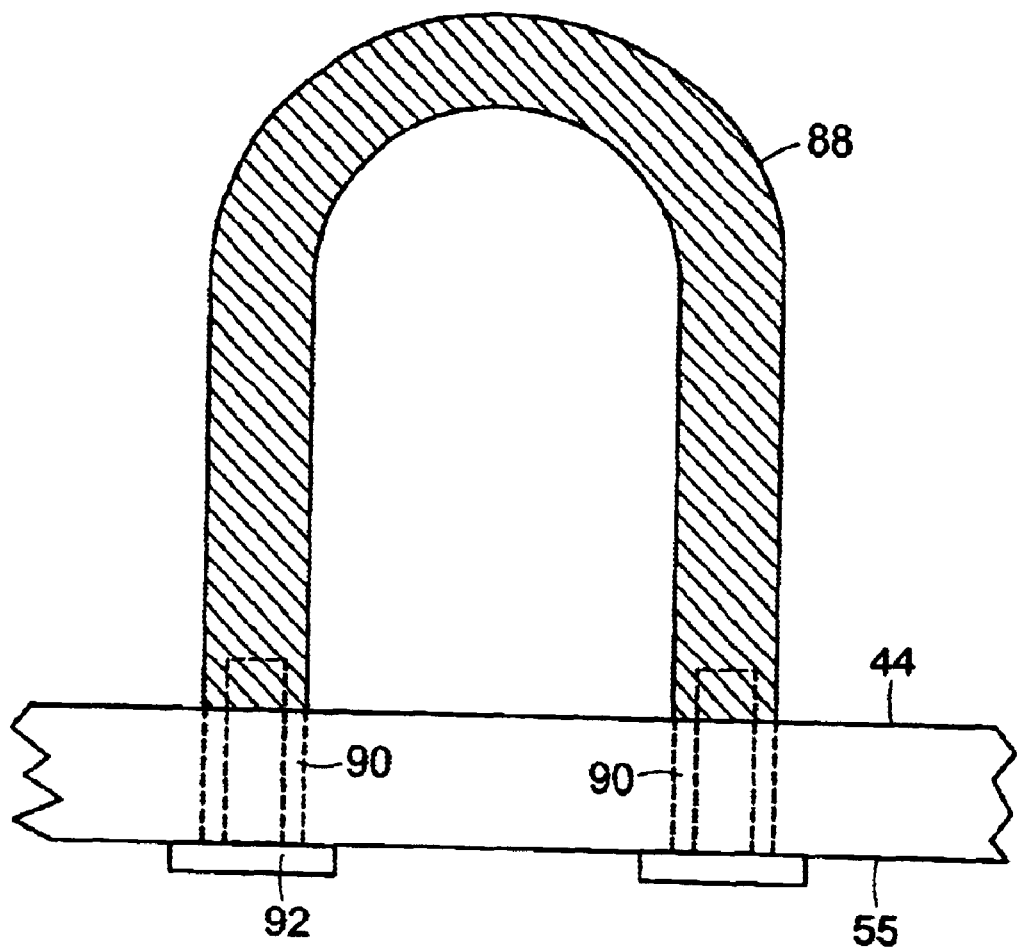
FIG. 6 illustrates a retainer clip of the heat sink apparatus of FIG. 5, according to one embodiment of the invention.

FIGS. 5 and 6 show an alternate embodiment of the retainer clips 36. In this embodiment, the retainer clips 36 include horseshoe clips 88. As described above, the lightweight heat sink 22 (e.g., heat sink having a folded fin structure) reduces the amount of force required to secure or couple the retainer clips 36 to the circuit board 44. The use the lightweight heat sink 22 reduces the forces needed to couple the horseshoe clips 88 and the circuit board 44 to withstand the expansive forces generated by the retainer 32. With the reduced forces, smaller than conventional holes can be place through the circuit board 44 to secure the horseshoe clips 88 to the circuit board 44

The horseshoe clips 88 mount to the circuit board 44 using a plurality of fasteners 92. The fasteners 92 engage a second surface 55 of the circuit board 44 and couple to the horseshoe clips 88 through a plurality of openings 90 defined by the circuit board 44. The openings 90 defined by the circuit board 44 have a diameter between 0.00160 inches and 0.0500 inches, for example. Such openings 90 are small, relative to the requirements for conventional fasteners (e.g., 0.375 inch diameter) and do not require a large area of the circuit board 44 to accommodate the fasteners 92. The diameter of the openings 90, therefore, limits (e.g., minimizes) interference between the openings 90 and the circuit board components or conductive traces associated with the circuit board 44.

Figure 7:
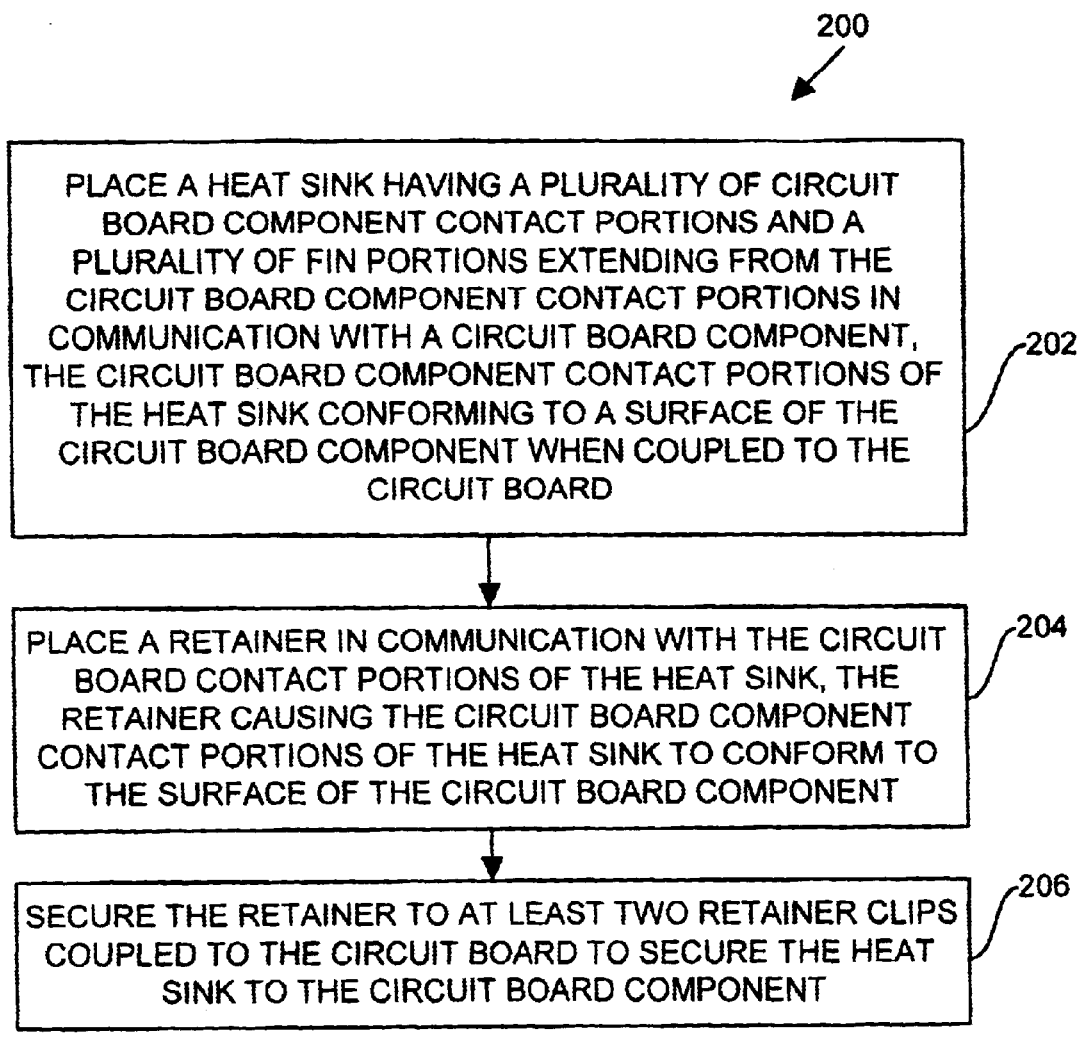
FIG. 7 illustrates a flowchart of procedure for assembling a heat sink apparatus, according to one embodiment of the invention.

FIG. 7 illustrates a flowchart for a method 200 of assembling a circuit board assembly. Such assembly can be performed either manually (e.g., by a technician on an assembly line) or automatically (e.g., by automated equipment).

In step 202, an assembler places a heat sink 22 having a plurality of circuit board component contact portions 30 and a plurality of fin portions 24 extending from the contact portions 30 in communication with a circuit board component 34. The circuit board component contact portions 30 of the heat sink 22 conform to a surface 35 of the circuit board component 34 when the heat sink 22 is coupled to the circuit board 44. In one embodiment, the assembler places a thermal transfer layer 52 between the heat sink 22 and the circuit board component 34. The thermal transfer layer 52 provides thermal transfer between the circuit board component 34 and the heat sink 22.

In step 204, the assembler places a retainer 32 in communication with the circuit board contact portions 30 of the heat sink 22. The retainer 32 causes the circuit board component contact portions 30 of the heat sink 22 to conform to the surface 35 of the circuit board component 34. In one embodiment, the assembler places a double buckling beam retainer 32 in communication with the circuit board contact portions 30 of the heat sink 22. The double buckling beam retainer 32 acts as a spring such that, when compressed, loads the circuit board contact portions 30 of the heat sink 22. In response to the loading by the retainer 32, the circuit board contact portions 30 of the heat sink 22 conform to the surface 35 of the circuit board component 34, thereby providing thermal coupling between the heat sink 22 and the circuit board component 34.

In step 206, the assembler secures the retainer 32 to at least two retainer clips 36 coupled to the circuit board 44 secure the heat sink 22 to the circuit board component 34. For example, as described above, when the assembler engages the clip engagement portions 42 of the retainer 32 with the retainer engagement portions 62 of the retainer clips 36, the clip engagement portions 42 of the retainer 32 creates an expansive force (e.g., spring force) against the retainer engagement portions 62 while the retainer engagement portion 62 creates an equal, compressive force against the clip engagement portions 42 of the retainer 32. Engagement between the portions 42, 62, therefore, maintains the load created by the retainer 32 on the heat sink 22.

In one embodiment, prior to placing the heat sink in communication with the circuit board component 34, the assembler secures or couples the at least two retainer clips 36 to a first surface 54 of the circuit board 44. As described above, the assembler uses a surface mounting adhesive (e.g., solder) or fasteners 92 in the securing process.

Those skilled in the art will understand that there can be many variations made to the embodiments explained above while still achieving the same objective of those embodiments and the invention in general.

As an example, the retainer 32 is formed of a metallic material. The metallic material, however, can act as an antenna to attract electromagnetic wave that can disturb the electronic components of the circuit board 44. In one embodiment, the metallic retainer 32 includes an EMI shield. The EMI shield limits electromagnetic disturbance to the electronic components of the circuit board 44 caused by the retainer 32. The EMI shield, in one embodiment, is integrally formed with the retainer 32. In another embodiment, the EMI shield is attached to the retainer as a separate component.

Such variations are intended to be covered by the scope of this invention. As such, the foregoing description of embodiments of the invention is not intended to be limiting. Rather, any limitations to the invention are presented in the following claims.

What is claimed is:

1. A heat sink apparatus for cooling a circuit board component mounted to a circuit board, the heat sink apparatus comprising:
   a heat sink having a plurality of circuit board component contact portions and a plurality of fin portions extending from the contact portions, the circuit board component contact portions of the heat sink conforming to a surface of the circuit board component when coupled to the circuit board component;
   a retainer in communication with the circuit board component contact portions of the heat sink, the retainer causing the circuit board component contact portions of the heat sink to conform to the surface of the circuit board component; and
   at least two retainer clips coupled to the circuit board, the retainer engageable with the retainer clips to secure the heat sink to the circuit board component.

2. The heat sink of claim 1 wherein the retainer comprises a double buckling beam retainer, the double buckling beam retainer causing the circuit board component contact portions of the heat sink to conform to the surface of the circuit board component.

3. The heat sink of claim 1 wherein the retainer clips comprise surface mount clips coupled to a first surface of the circuit board.

4. The heat sink of claim 3 wherein each surface mount clip comprises a plurality of mounting pads, each mounting pad forming an angle relative to the first surface of the circuit board, the angle of each mounting pad allowing for distribution of solder between the plurality of mounting pads and the first surface of the circuit board.

5. The heat sink of claim 1 wherein the retainer clips comprise horseshoe clips coupled to the circuit board using a plurality fasteners, the circuit board defining a plurality of openings for the fasteners, each opening having a diameter substantially between a range of 0.00160 inches and 0.0500 inches.

6. The heat sink of claim 1 wherein the heat sink apparatus further comprises a thermal transfer layer between the heat sink and the circuit board component, the thermal transfer layer providing thermal transfer between the circuit board component and the heat sink.

7. A circuit board assembly comprising:
   a circuit board including a section of circuit board material and a circuit board component mounted to the section of circuit board material;
   a heat sink apparatus that connects to the circuit board, the heat sink apparatus including:
      a heat sink having a plurality of circuit board component contact portions and a plurality of fin portions extending from the contact portions, the circuit board component contact portions of the heat sink conforming to a surface of the circuit board component when coupled to the circuit board component;
      a retainer in communication with the circuit board component contact portions of the heat sink, the retainer causing the circuit board component contact portions of the heat sink to conform to the surface of the circuit board component; and at least two retainer clips coupled to the circuit board, the retainer engageable with the retainer clips to secure the heat sink to the circuit board component.

8. The circuit board assembly of claim 7 wherein the retainer comprises a double buckling beam retainer, the double buckling beam retainer causing the lateral portions of the heat sink to conform to the surface of the circuit board component.

9. The circuit board assembly of claim 7 wherein the retainer clips comprise surface mount clips coupled to a first surface of the circuit board.

10. The circuit board assembly of claim 9 wherein each surface mount clip comprises a plurality of mounting pads, each mounting pad forming an angle relative to the first surface of the circuit board, the angle allowing for distribution of solder between the plurality of pads and the first surface of the circuit board.

11. The circuit board assembly of claim 7 wherein the retainer clips comprise horseshoe clips coupled adjacent to the circuit board component to the circuit board using a plurality fasteners, the circuit board defining a plurality of openings for the fasteners, each opening having a diameter substantially between a range of 0.00160 inches and 0.0500 inches.

12. The circuit board assembly of claim 7 wherein the heat sink apparatus further comprises a thermal transfer layer between the heat sink and the circuit board component, the thermal transfer layer providing thermal transfer between the circuit board component and the heat sink.

13. A method for assembling a circuit board assembly comprising the steps of:

placing a heat sink having a plurality of circuit board component contact portions and a plurality of fin portions extending from the circuit board component contact portions in communication with a circuit board component, the circuit board component contact portions of the heat sink conforming to a surface of the circuit board component when coupled to the circuit board;

placing a retainer in communication with the circuit board contact portions of the heat sink, the retainer causing the circuit board component contact portions of the heat sink to conform to the surface of the circuit board component; and securing the retainer to at least two retainer clips coupled to the circuit board to secure the heat sink to the circuit board component.

14. The method of claim 13 wherein the step of placing a retainer comprises placing a double buckling beam retainer in communication with the circuit board contact portions of the heat sink, the double buckling beam retainer causing the circuit board contact portions of the heat sink to conform to the surface of the circuit board component.

15. The method of claim 13 further comprising the step of securing the at least two retainer clips to a first surface of the circuit board.

16. The method of claim 13 further comprising the step of placing a thermal transfer layer between the heat sink and the circuit board component, the thermal transfer layer providing thermal transfer between the circuit board component and the heat sink.

17. A heat sink apparatus for cooling a circuit board component mounted to a circuit board, the heat sink apparatus comprising:

a heat sink having a folded fin structure, the folded fin structure having a plurality of circuit board component contact portions and a plurality of fin portions extending from the circuit board component contact portions, each fin portion having a first fin wall, a second fin wall, and a connection portion coupling the first fin wall and the second fin wall, the circuit board component contact portions of the heat sink conforming to a surface of the circuit board component when coupled to the circuit board component;

a double buckling beam retainer in communication with the circuit board component contact portions of the heat sink, the double buckling beam retainer causing the circuit board component contact portions of the heat sink to conform to the surface of the circuit board component; and at least two surface mount clips coupled to a first surface of the circuit board, the retainer engageable with the surface mount clips to secure the heat sink to the circuit board component.

18. A circuit board assembly comprising:

a circuit board including a section of circuit board material and a circuit board component mounted to the section of circuit board material;

a heat sink apparatus that connects to the circuit board, the heat sink apparatus including:

a heat sink having a folded fin structure, the folded fin structure having a plurality of circuit board component contact portions and a plurality of fin portions extending from the circuit board component contact portions, each fin portion having a first fin wall, a second fin wall, and a connection portion coupling the first fin wall and the second fin wall, the circuit board component contact portions of the heat sink conforming to a surface of the circuit board component when coupled to the circuit board component;

a double buckling beam retainer in communication with the circuit board component contact portions of the heat sink, the double buckling beam retainer causing the circuit board component contact portions of the heat sink to conform to the surface of the circuit board component; and at least two surface mount clips coupled to a first surface of the circuit board, the retainer engageable with the surface mount clips to secure the heat sink to the circuit board component.

19. A heat sink apparatus for cooling a circuit board component mounted to a circuit board, the heat sink apparatus comprising:

a heat sink having a folded fin structure, the folded fin structure having a plurality of circuit board component contact portions and a plurality of fin portions extending from the circuit board component contact portions, each fin portion having a first fin wall, a second fin wall, and a connection portion coupling the first fin wall and the second fin wall, the circuit board component contact portions of the heat sink conforming to a surface of the circuit board component when coupled to the circuit board component;

a double buckling beam retainer in communication with the circuit board component contact portions of the heat sink, the double buckling beam retainer causing the circuit board component contact portions of the heat sink to conform to the surface of the circuit board component; and at least two horseshoe clips coupled to the circuit board using a plurality fasteners, the circuit board defining a plurality of openings for the fasteners, each opening having a diameter between 0.00160 inches and 0.0500 inches, the retainer engageable with the surface mount clips to secure the heat sink to the circuit board component.

20. A circuit board assembly comprising:

a circuit board including a section of circuit board material and a circuit board component mounted to the section of circuit board material;

a heat sink apparatus that connects to the circuit board, the heat sink apparatus including:

a heat sink having a folded fin structure, the folded fin structure having a plurality of circuit board component contact portions and a plurality of fin portions extending from the circuit board component contact portions, each fin portion having a first fin wall, a second fin wall, and a connection portion coupling the first fin wall and the second fin wall, the circuit board component contact portions of the heat sink conforming to a surface of the circuit board component when coupled to the circuit board component;

a double buckling beam retainer in communication with the circuit board component contact portions of the heat sink, the double buckling beam retainer causing the circuit board component contact portions of the heat sink to conform to the surface of the circuit board component; and at least two horseshoe clips coupled to the circuit board using a plurality fasteners, the circuit board defining a plurality of openings for the fasteners, each opening having a diameter between 0.00160 inches and 0.0500 inches, the retainer engageable with the surface mount clips to secure the heat sink to the circuit board component.

* * * * *